(12) United States Patent
Huff et al.

(10) Patent No.: US 6,833,767 B1
(45) Date of Patent: Dec. 21, 2004

(54) FREQUENCY SYNTHESIZER USING DIGITAL PRE-DISTORTION AND METHOD

(75) Inventors: William J. Huff, La Jolla, CA (US); Lawrence J. Malone, Carlsbad, CA (US); Daniel R. Meacham, Del Mar, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/606,682

(22) Filed: Jun. 26, 2003

Related U.S. Application Data
(60) Provisional application No. 60/458,515, filed on Mar. 28, 2003.

(51) Int. Cl.[7] .................................................. H03L 3/00

(52) U.S. Cl. ............................ 331/17; 332/128; 331/23

(58) Field of Search ............................... 331/17, 25, 4, 331/23, 15, 1 R; 332/128, 124; 455/42, 110; 375/52, 302

(56) References Cited

U.S. PATENT DOCUMENTS

| | | | | |
|---|---|---|---|---|
| 4,052,672 A | * | 10/1977 | Enderby et al. | 332/144 |
| 4,242,649 A | * | 12/1980 | Washburn, Jr. | 332/128 |
| 4,546,331 A | * | 10/1985 | DaSilva et al. | 332/128 |
| 4,952,888 A | * | 8/1990 | Izumi | 332/124 |
| 5,266,907 A | * | 11/1993 | Dacus | 331/1 A |
| 6,172,579 B1 | * | 1/2001 | Dacus et al. | 332/128 |

* cited by examiner

Primary Examiner—Robert Pascal
Assistant Examiner—Joseph Chang (57) ABSTRACT

A method includes identifying a setting for a capacitor bank associated with a voltage-controlled oscillator in a closed-loop phase-locked-loop. The setting represents a combination of one or more capacitors in the capacitor bank. The method also includes estimating a gain introduced by the closed-loop phase-locked-loop when the oscillator operates using the identified setting. The method further includes estimating a response of a loop filter in the phase-locked-loop and identifying one or more coefficients for a digital filter using the identified gain and the identified loop filter response. The digital filter is operable to filter an input signal. In addition, the method includes modulating the filtered input signal using the phase-locked-loop to produce an output signal.

20 Claims, 3 Drawing Sheets

FREQUENCY SYNTHESIZER USING DIGITAL PRE-DISTORTION AND METHOD

CROSS REFERENCE TO RELATED APPLICATIONS

This application claims the benefit under 35 U.S.C. § 119(e) of U.S. Patent Application Ser. No. 60/458,515 filed on Mar. 28, 2003.

TECHNICAL FIELD

This disclosure is generally directed to communication systems and more specifically to a frequency synthesizer using digital pre-distortion and method.

BACKGROUND

Wireless communication devices typically include a frequency synthesizer, which is often a critical component of many techniques used to modulate data onto an outgoing wireless signal. Conventional modulation techniques, such as Gaussian Frequency Shift Keyed (GFSK) modulation, are typically implemented using either I-Q up-conversion or by direct open-loop modulation of a voltage-controlled oscillator (VCO). The up-conversion approach is often susceptible to an undesired image signal and is typically costly in terms of analog area and power. The open-loop modulation approach is often prone to frequency drift in the voltage-controlled oscillator and to gain errors.

SUMMARY

This disclosure provides a frequency synthesizer using digital pre-distortion and method.

In one aspect, a method includes identifying a setting for a capacitor bank associated with a voltage-controlled oscillator in a closed-loop phase-locked-loop. The setting represents a combination of one or more capacitors in the capacitor bank. The method also includes estimating a gain introduced by the closed-loop phase-locked-loop when the oscillator operates using the identified setting. The method further includes estimating a response of a loop filter in the phase-locked-loop and identifying one or more coefficients for a digital filter using the identified gain and the identified loop filter response. The digital filter is operable to filter an input signal. In addition, the method includes modulating the filtered input signal using the phase-locked-loop to produce an output signal.

One or more technical features may be present according to various embodiments of this disclosure. Particular embodiments of this disclosure may exhibit none, some, or all of the following features depending on the implementation. For example, in one embodiment, a frequency synthesizer using digital pre-distortion is provided. In particular, the frequency synthesizer uses closed-loop modulation of a phase-locked-loop to produce an output signal. The use of closed-loop modulation may introduce various irregularities in the output signal. As examples, the output signal may suffer from loop gain in the phase-locked-loop and from variations in a loop filter used in the phase-locked-loop.

To at least partially compensate for the various irregularities in the output signal, the frequency synthesizer also includes a digital pre-distortion filter. The pre-distortion filter distorts an input signal before it is modulated by the phase-locked-loop to produce the output signal. This distortion changes the input signal in such a way as to at least partially correct for the irregularities introduced by the phase-locked-loop. As a result, the output signal produced may have fewer or no irregularities. In a particular embodiment, the pre-distortion filter distorts the input signal such that the output signal is compliant with the Bluetooth standard.

This has outlined rather broadly several features of this disclosure so that those skilled in the art may better understand the DETAILED DESCRIPTION that follows. Additional features may be described later in this document. Those skilled in the art should appreciate that they may readily use the concepts and the specific embodiments disclosed as a basis for modifying or designing other structures for carrying out the same purposes of this disclosure. Those skilled in the art should also realize that such equivalent constructions do not depart from the spirit and scope of the invention in its broadest form.

Before undertaking the DETAILED DESCRIPTION below, it may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, or software, or a combination of at least two of the same. It should be noted that the functionality associated with any particular controller may be centralized or distributed, whether locally or remotely. Definitions for certain words and phrases are provided throughout this patent document, and those of ordinary skill in the art should understand that in many, if not most instances, such definitions apply to prior as well as future uses of such defined words and phrases.

BRIEF DESCRIPTION OF THE DRAWINGS

For a more complete understanding of this disclosure and its features, reference is now made to the following description taken in conjunction with the accompanying drawings, in which.

DETAILED DESCRIPTION

Figure 1:
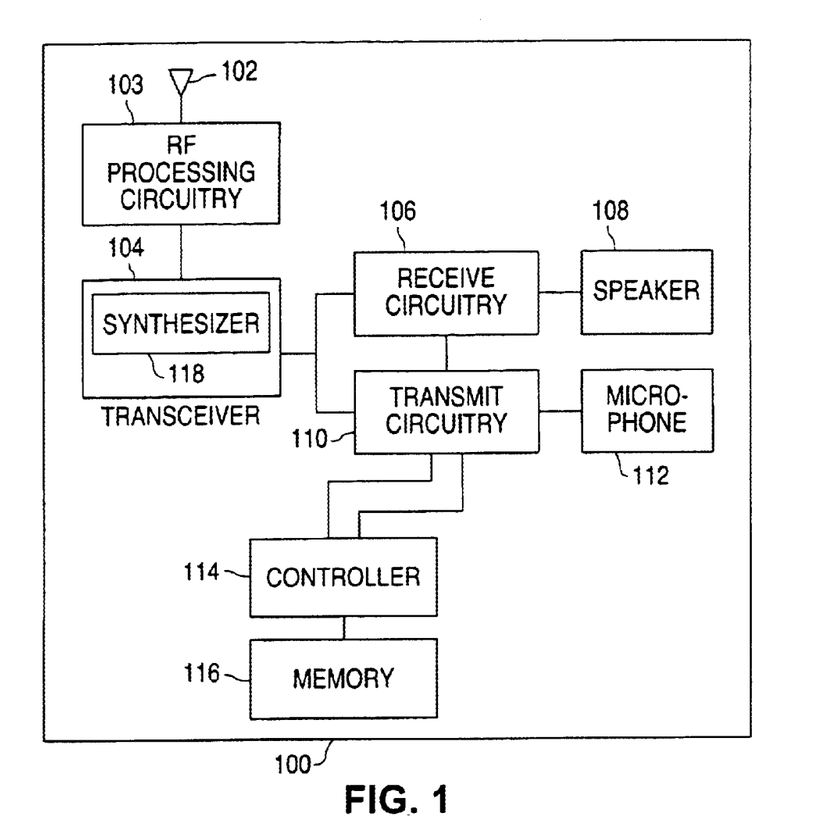
FIG. 1 illustrates an example wireless device according to one embodiment of this disclosure.

FIG. 1 illustrates an example wireless device 100 according to one embodiment of this disclosure. The wireless device 100 illustrated in FIG. 1 is for illustration only. Other wireless devices could be used without departing from the scope of this disclosure. Also, the wireless device 100 in FIG. 1 has been simplified for ease of illustration and explanation. Other or additional components could be included in the wireless device 100.

In the illustrated embodiment, the wireless device 100 includes an antenna 102. The antenna 102 facilitates the communication of information over a wireless interface. The antenna 102 may represent any suitable structure that is operable to facilitate the transmission or reception of wireless signals. As a particular example, the antenna 102 may support the transmission and reception of radio frequency signals.

Radio frequency (RF) processing circuitry 103 is coupled to the antenna 102. In this document, the term "couple" refers to any direct or indirect communication between two or more components, whether or not those components are in physical contact with one another. The RF processing circuitry 103 processes the signals transmitted or received by the antenna 102. As particular examples, the RF processing circuitry 103 could include one or more low-noise amplifiers, mixers, filters, and power amplifiers.

A transceiver 104 is coupled to the RF processing circuitry 103. The transceiver 104 may receive an incoming signal received by the antenna 102 and down-convert the signal to generate a baseband or intermediate frequency signal. The transceiver 104 may also receive a baseband signal or an intermediate frequency signal and up-convert the signal for transmission by the antenna 102. The transceiver 104 could include any hardware, software, firmware, or combination thereof for facilitating communication using the antenna 102. As a particular example, the transceiver 104 could include a transmitter and a receiver.

Receive circuitry 106 is coupled to the transceiver 104. The receive circuitry 106 receives and processes incoming signals received by the wireless device 100. For example, the receive circuitry 106 may receive the baseband or intermediate frequency signal produced by the transceiver 104 and process the signal to extract information contained in the signal. The receive circuitry 106 may include any hardware, software, firmware, or combination thereof for processing incoming signals, such as a filter or decoder. In the illustrated example, the incoming signal represents voice information, and the extracted voice information may be provided to a speaker 10B for presentation to a user.

Transmit circuitry 110 is coupled to the transceiver 104. The transmit circuitry 110 receives and processes outgoing signals for transmission by the wireless device 100. For example, the transmit circuitry 110 may receive voice information and process the information to produce a baseband or intermediate frequency signal. The baseband or intermediate frequency signal may then be provided to the transceiver 104. The transmit circuitry 110 may include any hardware, software, firmware, or combination thereof for processing outgoing signals, such as a filter or an encoder. In the illustrated example, the outgoing signal may include voice information collected by a microphone 112.

A controller 114 is connected to the receive circuitry 106 and the transmit circuitry 110. The controller 114 controls the operation and behavior of the wireless device 100. For example, the controller 114 could allow a user to mute the wireless device 100 so that no voice information is transmitted by the wireless device 100. In this example, the controller 114 may instruct the transmit circuitry 110 to stop transmitting information when the wireless device 100 is muted. The controller 114 could represent any suitable controller, such as a processor. The logic executed by the controller 114 could be stored in a memory 116, which may represent any suitable storage and retrieval device or devices. In other embodiments, the controller 114 and the memory 116 could be omitted from the wireless device 100.

In one aspect of operation, the wireless device 100 may include a frequency synthesizer, such as a frequency synthesizer 118 in the transceiver 104. The frequency synthesizer 118 uses closed-loop modulation of a phase-locked-loop (PLL) to produce a phase or frequency modulated output signal, such as the outgoing signal transmitted by the antenna 102. The use of closed-loop modulation may introduce various irregularities in the output signal. To at least partially compensate for the various irregularities in the output signal, the frequency synthesizer 118 includes a digital pre-distortion filter, which distorts an input signal before it is modulated by the phase-locked-loop to produce the output signal. This distortion changes the input signal in a way that at least partially corrects for the irregularities introduced by the phase-locked-loop. As a result, the phase-locked-loop may produce an output signal having fewer or no irregularities.

This frequency synthesizer 118 could be used in any suitable wireless device 100. For example, the wireless device 100 could represent a Bluetooth device, a Digital Enhanced Cordless Telephone (DECT) device, or a Global System for Mobile communication (GSM) device. In the example shown in FIG. 1, the wireless device 100 could represent a mobile headset that may be worn by a user and that facilitates the communication of voice information to and from a mobile or other telephone. The wireless device 100 could also represent a mobile handset, a base station, or any other suitable device. The frequency synthesizer 118 could also support any suitable modulation technique, including Frequency Shift Keyed (FSK) modulation, Gaussian Frequency Shift Keyed (GFSK) modulation, or Gaussian Minimum Shift Keyed (GMSK) modulation.

Although FIG. 1 illustrates one example of a wireless device 100, various changes may be made to FIG. 1. For example, other one-way or multi-way communication devices could be used. As a particular example, FIG. 1 illustrates a wireless device 100 providing voice services. Other devices, such as devices connecting a computer to a printer or to a personal digital assistant, could use the frequency synthesizer 118. Also, various components could be combined or omitted or additional components can be added to the wireless device 100 according to particular needs. In addition, the transceiver 104 could be replaced by a transmitter, and the receive circuitry 106 could be omitted in the wireless device 100.

Figure 2:
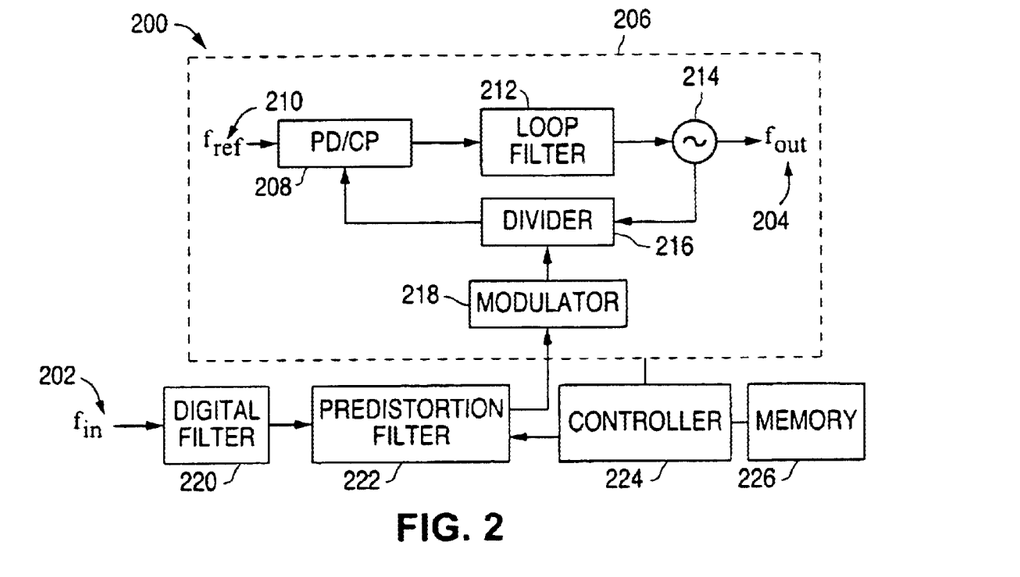
FIG. 2 illustrates an example frequency synthesizer according to one embodiment of this disclosure.

FIG. 2 illustrates an example frequency synthesizer 200 according to one embodiment of this disclosure. The frequency synthesizer 200 illustrated in FIG. 2 may, for example, be used as the frequency synthesizer 118 in the wireless device 100 of FIG. 1. The frequency synthesizer 200 shown in FIG. 2 is for illustration only. Other embodiments of the frequency synthesizer 200 could be used without departing from the scope of this disclosure.

The frequency synthesizer 200 is operable to receive an input signal ($f_{in}$) 202 and produce an output signal ($f_{out}$) 204, where $f_{in}$ represents a desired value for the instantaneous output frequency and $f_{out}$ is the actual instantaneous output frequency. In the illustrated example, the frequency synthesizer 200 includes a phase-locked-loop 206. The phase-locked-loop 206 is used to produce the output signal 204 by modulating the input signal 202. In a particular embodiment, a Bluetooth-compliant wireless device 100 can transmit or receive GFSK modulated data on one of eighty 1 MHz channels spanning 2.402–2.480 GHz. In this embodiment, the frequency synthesizer 200 pre-distorts the input signal 202 before it is modulated, and the pre-distortion alters the input signal 202 so the output signal 204 is compliant with the Bluetooth standard.

In this example, the phase-locked-loop 206 includes a phase detector/charge pump (PD/CP) 208. The phase detector 208 identifies a phase difference between a reference signal ($f_{ref}$) 210 and a signal provided by a frequency divider 216. The phase detector/charge pump 208 outputs a signal proportional to this phase difference.

A loop filter 212 is coupled to the phase detector/charge pump 208. The loop filter 212 filters the signal generated by the phase detector/charge pump 208. The loop filter 212 may represent any suitable filter, such as a low-pass filter or a band-pass filter. In other embodiments, the loop filter 208 could be omitted from the frequency synthesizer 200.

A voltage-controlled oscillator (VCO) 214 is coupled to the loop filter 212. The oscillator 214 is operable to produce the output signal 204. In one embodiment, the frequency of the signal produced by the oscillator 214 is controlled by the signal produced by the phase detector/charge pump 208 and filtered by the loop filter 212. The oscillator 214 may include any suitable oscillator operable to generate the output signal 204.

In one embodiment, the oscillator 214 includes a capacitor bank that has selectable capacitors. In this embodiment, the frequency of the output signal 204 generated by the oscillator 214 can be at least partially controlled by selecting various combinations of capacitors in the capacitor bank. In a particular embodiment, the capacitor bank in the oscillator 214 includes 64 different settings corresponding to a range of approximately 500 MHz with approximately 8 MHz per setting.

A frequency divider 216 is coupled to the oscillator 214 and to the phase detector/charge pump 208. The divider 216 is operable to alter the frequency of the output signal 204 produced by the oscillator 214. The divider 216 then provides the altered output signal to the phase detector/charge pump 208. By controlling how the divider 216 alters the frequency of the output signal 204, the behavior of the phase-locked-loop 206 can be controlled.

A modulator 218 is coupled to the divider 216. The modulator 218 is operable to receive and modulate the input signal 202. The resulting modulated signal is provided to the divider 216, which uses the modulated signal to alter the output signal 204 generated by the oscillator 214. In this way, the modulator 218 controls the operation of the divider 216, which allows the modulator 218 to control the operation of the phase-locked-loop 206. The modulator 218 may represent any suitable modulator, such as a Delta-Sigma (ΔS) modulator.

The frequency synthesizer 200 also includes a digital filter 220. The digital filter 220 performs data filtering on the input signal 202 before the input signal is modulated by the phase-locked-loop 206. The digital filter 220 may represent any suitable digital filter. In a particular embodiment, the digital filter 220 represents a digital Gaussian filter that performs filtering for the Bluetooth standard.

The phase-locked-loop 206 shown in FIG. 2 represents a closed-loop modulator, which may introduce various irregularities into the output signal 204. For example, the phase-locked-loop 206 may introduce gain into the output signal 204. Also, variations in the loop-filter 212 may alter the output signal 204 in undesired ways. Further, due to noise considerations, it may be difficult to implement a closed-loop phase-locked-loop 206 with a wide enough, loop bandwidth to modulate data directly. As a particular example, the phase-locked-loop 206 may have a loop bandwidth of 100 kHz and a data modulation bandwidth of greater than 100 kHz. If left uncompensated, the response of this phase-locked-loop 206 could cause unwanted low-pass filtering of the input signal 202.

To help compensate for these or other irregularities, a pre-distortion filter 222 is provided in the frequency synthesizer 200. The digital pre-distortion filter 222 is coupled to the digital filter 220 and the modulator 218. As described below, the digital pre-distortion filter 222 is inserted in the data signal path to cancel the response of the phase-locked-loop 206. In effect, the digital pre-distortion filter 222 alters the input signal 202 so that the variations produced by the phase-locked-loop 206 are at least partially reduced or eliminated. The digital pre-distortion filter 222 may represent any suitable digital filter. In one embodiment, the digital pre-distortion filter 222 includes adjustable coefficients, which may be altered to change the behavior of the digital pre-distortion filter 222.

As described below, various functions may be performed to control the operation of the frequency synthesizer 200. This may include the execution of a tuning algorithm that controls the selection of capacitors in the capacitor bank of the voltage-controlled oscillator 214. This may also include an algorithm for estimating the loop gain of the phase-locked-loop 206 and an algorithm for estimating the response of the loop filter 212. In addition, this may include an algorithm for calculating the coefficient settings of the pre-distortion filter 222. In one embodiment, some or all of these algorithms could represent on-chip algorithms. In one embodiment, the frequency synthesizer 200 includes a controller 224 that executes the algorithms and a memory 226 that stores the algorithms. Other embodiments of the frequency synthesizer 200 could also be used.

In a particular embodiment, the frequency synthesizer 200 supports the Bluetooth standard. The Bluetooth standard represents a frequency hopping system, where receive-to-transmit turnaround time is 220 μs, and the settling time of the frequency synthesizer 200 is less than that when software and baseband overhead is considered. The various algorithms described above may be executed each time a frequency hop is performed, which helps to account for:

(1) different capacitor select settings in the capacitor bank of the oscillator 214 over process, temperature, and the Bluetooth frequency range;

(2) different gains (and hence different loop gains) over process, temperature, and the Bluetooth frequency range; and (3) different component values in the loop filter 212 over process and temperature.

For many wireless communication systems, the time spent on one transmission may be relatively short. Thus, for a given transmission, the temperature variation may be small, so the capacitor selection, gain calibration and loop filter calibration could be essentially static.

Although FIG. 2 illustrates one example of a frequency synthesizer 200, various changes may be made to FIG. 2. For example, the loop filter 212 may be removed from the frequency synthesizer 200. Also, the digital filter 220 and the digital pre-distortion filter 222 could be combined into a single filter.

Figure 3:
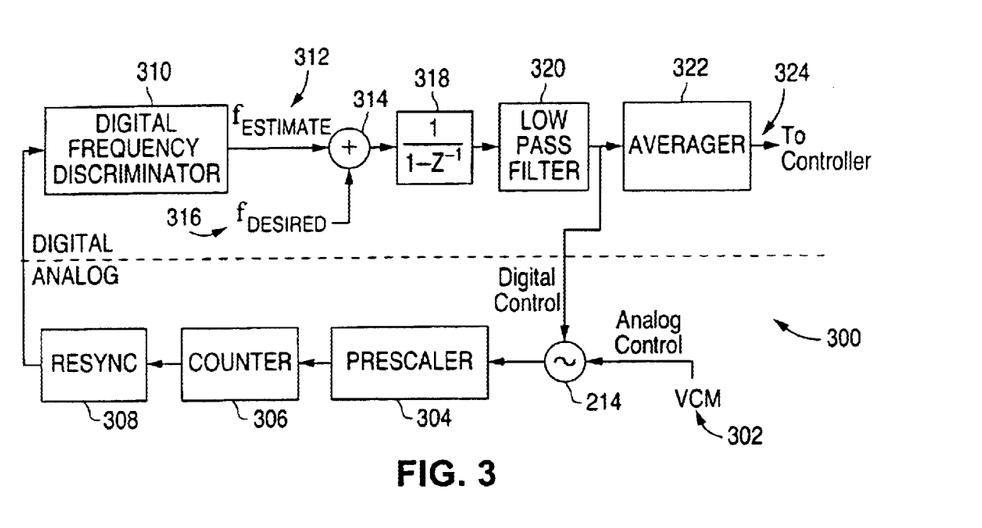
FIG. 3 illustrates an example capacitor selection circuit according to one embodiment of this disclosure.

FIG. 3 illustrates an example capacitor selection circuit 300 according to one embodiment of this disclosure. The capacitor selection circuit 300 may, for example, be used in the frequency synthesizer 200 of FIG. 2 to select the capacitors used in the capacitor bank of the voltage-controlled oscillator 214. Other embodiments of the capacitor selection circuit 300 is may be used without departing from the scope of this disclosure.

In the illustrated example, the frequency synthesizer 200 is configured as a digital frequency-locked loop. In this example, the frequency of the signal produced by the voltage-controlled oscillator 214 is controlled by selecting various combinations of capacitors in a capacitor bank. Each combination of capacitors may correspond to a different setting. In a particular embodiment, the capacitor bank includes 64 different settings, which can be represented by a six-bit value.

The frequency synthesizer 200 may execute a capacitor selection algorithm to select a setting for the capacitor bank in the oscillator 214. During the execution of this algorithm, the oscillator 214 receives a common mode voltage (VCM) 302. In this embodiment, the input to the voltage-controlled oscillator (vCO) 214 is forced to the common mode voltage 302, and the VCO 214 is in the center of its analog tuning range. In other embodiments, a different voltage input to the VCO 214 may be appropriate.

The signal produced by the oscillator 214 is supplied to a prescaler 304. The prescaler 304 receives and divides the signal from the oscillator 214. For example, the prescaler 304 may divide the signal produced by the oscillator 214 by eight. In effect, this decreases the frequency of the signal produced by the oscillator 214 by a factor of eight. The prescaler 304 may is represent any suitable structure that can divide the frequency of a signal.

The prescalar 304 supplies the divided signal to a counter 306. The counter 306 is clocked by the prescaler 304 to produce an output counter signal. The counter 306 could represent any suitable counter, such as an M counter. The output signal from the counter 306 is supplied to a re-sync unit 308. The re-sync unit 306 synchronizes the output signal of the counter 306 with the digital components of the capacitor selection circuit 300. The re-sync unit 308 may represent any suitable structure for synchronizing a signal with a digital domain. In other embodiments, other circuits providing a digital estimate of the VCO's instantaneous output could be used.

A digital frequency discriminator 310 estimates the frequency of the signal produced by the counter 306. In one embodiment, the digital frequency discriminator 310 receives the reference signal 210 and counts the number of outputs produced by the counter 306 during each cycle of the reference signal 210. The digital frequency discriminator 310 then outputs an estimated frequency ($f_{ESTIMATE}$) 312 representing an estimate of the frequency of the counter 306. Because the output of the counter 306 represents a scaled version of the signal output by the oscillator 214, the estimated frequency 312 also represents an is estimate of the frequency of the oscillator 214. In a particular embodiment, the signal 312 has a frequency of:

$$f_{ESTIMATE} = \frac{\frac{f_{VCO}}{8}}{f_{REF}}$$

where $f_{VCO}$ represents the frequency of the signal produced by the oscillator 214, and FREF represents the reference frequency 210 provided to the frequency synthesizer 200.

An adder 314 is coupled to the digital frequency discriminator 310. The adder 314 is operable to receive the estimated frequency 312 produced by the digital frequency discriminator 310 and a desired frequency ($f_{DESIRED}$) 316 identifying the desired frequency of the signal 312. The adder 314 then subtracts the estimated frequency 312 from the desired frequency 316 to calculate a difference between the frequencies 312, 316. The adder 314 may include any suitable structure operable to identify the difference between two signals. An integrator 318 receives the results of the subtraction performed by the adder 314. The integrator 318 accumulates the differences produced by the adder 314. The integrator 318 may represent any suitable accumulator.

A low-pass filter 320 is coupled to the integrator 318 and filters the accumulated differences produced by the integrator 318. For example, the low-pass filter 320 may attenuate feedback variation caused by frequency quantization noise. The filtered signals produced by the filter 320 are averaged by an averaging unit 322. The resulting average 324 represents one of the capacitor settings in the capacitor bank of the voltage-controlled oscillator 214.

In one aspect of operation, the voltage-controlled oscillator 214 contains a bank of selectable capacitors, which allows the frequency of the voltage-controlled oscillator 214 to be coarsely set. A capacitor selection algorithm in the frequency synthesizer 200 is executed, which configures the frequency synthesizer 200 as a digital frequency-locked loop. For example, the capacitor selection algorithm could cause the oscillator 214 to begin receiving the common mode voltage 302. The capacitor selection algorithm then allows the capacitor selection circuit 300 to operate. The capacitor selection circuit 300 digitally estimates the frequency of the oscillator 214 and chooses the setting of the capacitor bank based on this frequency estimate. The feedback path in the capacitor selection circuit 300 may continuously adjust the capacitor select setting of the oscillator 214 so that the estimated frequency 312 remains equal to or approximately equal to the desired frequency 316. The average capacitor select value 324 produced by the averaging unit 322 may be stored for use during the remainder of a transmission by the frequency synthesizer 200. In one embodiment, this mechanism may be faster than conventional approaches, such as successive-approximation register (SAR) algorithms, because the output of the oscillator 214 may be sampled more often. This may help to reduce frequency quantization error and reduce the time needed for an accurate frequency estimate.

Although FIG. 3 illustrates one example of a capacitor selection circuit 300, various changes may be made to FIG. 3. For example, other or additional components could be used in the capacitor selection circuit 300.

Figure 4:
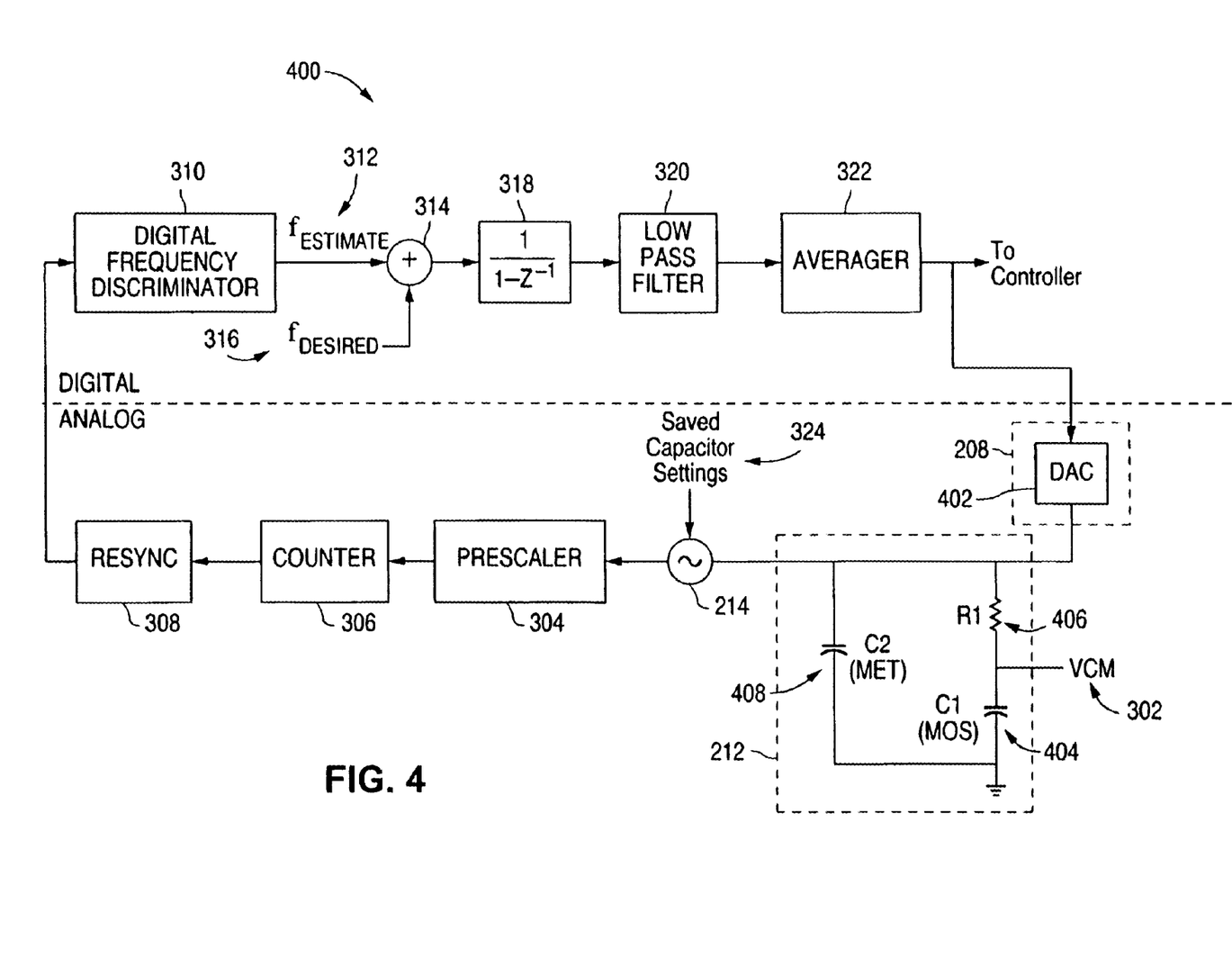
FIG. 4 illustrates an example gain calibration circuit according to one embodiment of this disclosure.

FIG. 4 illustrates an example gain calibration circuit 400 according to one embodiment of this disclosure. The gain calibration circuit 400 may, for example, be used in the frequency synthesizer 200 of FIG. 2 to identify the gain introduced by the phase-locked-loop 206. Other embodiments of the gain calibration circuit 400 may be used without departing from the scope of this disclosure.

In the illustrated example, the frequency synthesizer 200 is again configured as a digital frequency-locked loop. In this example, the frequency of the signal produced by the voltage-controlled oscillator 214 is controlled using an adjustable current digital-to-analog converter (DAC) 402 in the is charge pump 208 of the phase-locked-loop 206.

As shown in FIG. 4, the gain calibration circuit 400 includes the voltage-controlled oscillator 214 of FIG. 2 and the components 304–322 from the capacitor selection circuit 300 of FIG. 3. In this embodiment, the average capacitor select value 324 previously produced by the capacitor selection circuit 300 is saved and supplied to the voltage-controlled oscillator 214. A gain calibration algorithm is then executed to estimate the open loop unity gain bandwidth $\omega_{LOOP}$ of the phase-locked-loop 206. This information is used to select a setting for the DAC 402 in the charge pump 208. This information is also used to calculate coefficients for the pre-distortion filter 222.

During execution of the gain calibration algorithm, the gain calibration algorithm configures the frequency synthesizer 200. For example, the loop filter 212 is configured so that a first capacitor 404 is shorted to the common mode voltage 302 (using a switch or other suitable mechanism). Also, in one embodiment, the current supplied to the charge pump 208 in the phase-locked-loop 206 is selectable by a three-bit DAC 402. The phase detector 208 in the phase-locked-loop 206 includes UP and DOWN outputs, which are overridden so that that charge pump current is either positive or negative. From the three-bit value for the charge pump 208 and by overriding the UP and DOWN outputs of the phase detector 208, the charge pump 208 is configured as a four-bit, sign+magnitude current-mode DAC.

At this point, the analog input voltage to the voltage-controlled oscillator 214 is set by the charge pump DAC current into a resistor 406 in the loop filter 212, which controls the frequency of the oscillator 214. The analog input voltage of the oscillator 214 may be determined using the formula:

where VCM is the common mode voltage 302 in the center of the analog tuning range of the oscillator 214, $DAC_{SETTING}$ is the digital DAC input, $I_{LSB}$ is the LSB size of the charge pump DAC, and $R_1$ is the loop filter resistor 406. On average, the output frequency of the oscillator 214 may be determined using the formula:

$$f_{out} = f_0 + DAC_{SETTING}(I_{LSB} R_1 K_{VCO})$$

where $f_0$ is the output frequency of the oscillator 214 with the analog input voltage at VCM 302 for the saved capacitor select setting, and $K_{VCO}$ represents the gain of the oscillator 214.

In one embodiment, the gain calibration algorithm performs the following steps:

(1) Set the desired frequency to $f_{DESIRED} = f_{CHAN} - \Delta f$, forcing the average output frequency to $f_{CHAN} - \Delta f$, where $f_{CHAN}$ is the channel frequency, and $\Delta f$ is a frequency value chosen to make a good two-point linear approximation to the loop gain of the phase-locked-loop 206.

(2) After the loop settles, save the average charge pump DAC input value as $DAC_{NEG}$. Thus, $$f_{CHAN} - \Delta f = f_0 - DAC_{NEG}(I_{LSB} R_1 K_{VCO}).$$

(3) Set the desired frequency to $f_{DESIRED} = f_{CHAN} + \Delta f$, forcing the average output frequency to $f_{CHAN} + \Delta f$.

(4) After the loop settles, save the average charge pump DAC input value as $DAC_{POS}$. Thus, $$f_{CHAN} + \Delta f = f_0 + DAC_{POS}(I_{LSB} R_1 K_{VCO}).$$

(5) Calculate $\Delta DAC = DAC_{POS} - DAC_{NEG}$, where $$\Delta DAC = DAC_{POS} - DAC_{NEG} = \frac{2\Delta f}{I_{LSB} R_1 K_{VCO}}.$$

(6) The approximate unity gain bandwidth of the phase-locked-loop may be determined using the formula:

$$\omega_{LOOP} = \frac{I_p K_{VCO} R_1 C_1}{2\pi(C_1 + C_2)N},$$

where $I_p$ represents the current through the phase detector/charge pump 208, and N represents the scale by which the divider 216 divides the output signal 204.

(7) Using the $\Delta DAC$ and $\omega_{LOOP}$ values, given a desired loop gain $\omega_{LOOP}$ DESIRED, a corresponding ideal DAC setting $DAC_{IDEAL}$ can be determined as follows:

$$DAC_{IDEAL} = \frac{\Delta DAC \omega_{LOOP\_DESIRED} 2\pi(C_1 + C_2)N}{2\Delta f C_1}.$$

(8) In one embodiment, a 3-bit DAC 402 is used in the charge pump 208. As a result, the calculated $DAC_{IDEAL}$ value for a desired loop gain may not be precisely set. Therefore, $DAC_{IDEAL}$ may be rounded down to $DAC_{ACTUAL}$, which is the 3-bit DAC setting once the phase-locked-loop 206 is configured as a standard phase-locked-loop 206. This allows an actual loop gain close to the desired loop gain.

(9) The error between the actual loop gain (based on the actual 3-bit charge pump DAC) and an ideal charge pump current is calculated. This error value is used later to calculate coefficients for the pre-distortion filter 222. Thus, $$\omega_{LOOP\_ACTUAL} = \frac{DAC_{ACTUAL}}{DAC_{IDEAL}} \omega_{LOOP\_IDEAL}.$$

A resistor-capacitor (RC) tuner algorithm may also be executed by the frequency synthesizer 200. In a particular embodiment, the RC tuner algorithm is executed concurrently with the gain calibration algorithm. Also, in a particular embodiment, separate tuner algorithms could be executed for the metal capacitor 404 (which may represent a small loop filter capacitor) and for a MOS capacitor 408 (which may represent a large loop filter capacitor). Actual values for $\omega_Z$ (the loop filter zero) and $\omega_{P2}$ (the loop filter pole), $\omega_{Z\_ACTUAL}$ and $\omega_{P2\_ACTUAL}$, can be calculated and expressed as:

$$\omega_{Z\_ACTUAL} = \omega_{Z\_NOMINAL} \omega_{Z\_ERROR}$$

$$\omega_{P2\_ACTUAL} = \omega_{P2\_NOMINAL} \omega_{P2\_ERROR}.$$

where $\omega_{Z\_NOMINAL}$ and $\omega_{P2\_NOMINAL}$ represent the estimated loop filter zero and loop filter pole, and $\omega_{Z\_ERROR}$ and $\omega_{P2\_ERROR}$ represent the error calculated above.

After the capacitor select, gain calibration, and RC tuner algorithms have been executed, the frequency synthesizer 200 may be configured as a Frac-N frequency synthesizer having a standard phase-locked-loop with the charge pump DAC 402 set to $DAC_{ACTUAL}$. The loop gain control reduces settling time and noise variation.

In one embodiment, the transfer function from the input of the Delta-Sigma modulator 218 to the output of the phase-locked-loop 206 is:

$$H_{PLL}(s) \cong \frac{f_{REF}\left(1 + \frac{s}{\omega_z}\right)}{1 + \frac{s}{\omega_Z} + \frac{s^2}{\omega_{LOOP}\omega_Z} + \frac{s^3}{\omega_{P2}\omega_{LOOP}\omega_Z}}.$$

To compensate for this response of the phase-locked-loop 206, the frequency response of the pre-distortion filter 222 may approximate the inverse of the phase-locked-loop's response. By using the transform $s \Leftrightarrow f_{REF}(1-Z^{-1})$, the transfer function of the desired pre-distortion filter 222 may be determined using the formula:

$$H_{PRE}(Z) = \frac{1 + B_1(1-Z^{-1}) + B_2(1-Z^{-1})^2 + B_3(1-Z^{-1})^3}{1 + A_1(1-Z^{-1})}$$

where:

$$B_1 = \frac{f_{REF}}{\omega_z} \quad B_2 = \frac{f^2_{REF}}{\omega_{LOOP}\omega_z} \quad B_3 = \frac{f^3_{REF}}{\omega_{P2}\omega_{LOOP}\omega_z} \quad A_1 = \frac{f_{REF}}{\omega_z}.$$

Using the calculated values for $\omega_{LOOP\_ACTUAL}$, $\omega_{Z\_ACTUAL}$, and $\omega_{P2\_ACTUAL}$, the coefficient values in this formula may be calculated. These coefficient values may then be used in the pre-distortion filter 222, which filters the input signal 202 according to the coefficients. In one embodiment, the filter coefficients may be updated in the pre-distortion filter 222 during settling of the phase-locked-loop 206 before data is transmitted, which may avoid transients in the digital filters 220, 222.

In other embodiments, compensation for the loop gain and the loop filter variation could be done using a higher resolution charge-pump DAC 402 and switches in the loop filter is 212. These could be used to adjust the component values of the loop filter 212.

In a particular embodiment, the frequency synthesizer 200 may be implemented in 0.25 $\mu$m CMOS. In this embodiment, the frequency synthesizer 200 could use approximately 35 mA and occupy approximately 4 mM$^2$ die area. In this embodiment of the frequency synthesizer 200, the time for the various algorithms to be executed and for the output signal 204 to settle may take approximately 140 As.

Although FIG. 4 illustrates one example of a gain calibration circuit 400, various changes may be made to FIG. 4 For example, other or additional components could be used in the gain calibration circuit 400.

Figure 5:
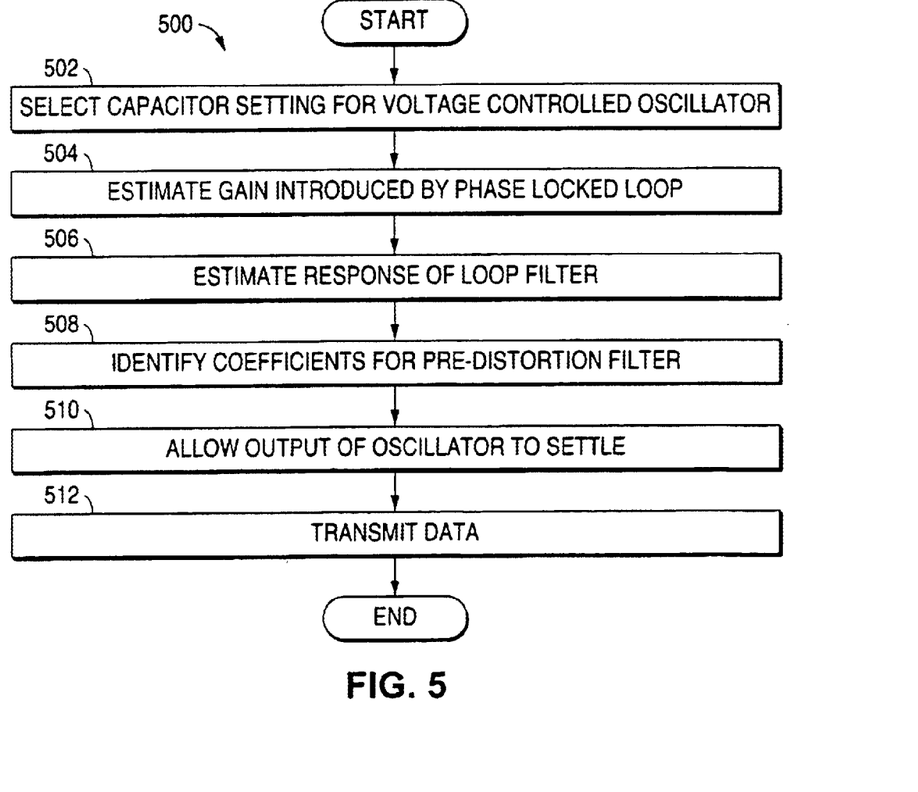
FIG. 5 illustrates an example method for digital pre-distortion according to one embodiment of this disclosure.

FIG. 5 illustrates an example method 500 for digital pre-distortion according to one embodiment of this disclosure. The method 500 may be described with respect to the frequency synthesizer 200 of FIG. 2. The method 500 could be used by any other suitable frequency synthesizer.

The frequency synthesizer 200 selects a capacitor setting for a voltage-controlled oscillator 214 at step 502. This may include, for example, the controller 224 configuring the frequency synthesizer 200 as a frequency-locked loop. This may also include the controller 224 allowing the capacitor select circuit 300 to operate and identify a capacitor setting that causes the estimated frequency 312 to equal or approximately equal the desired frequency 316.

The frequency synthesizer 200 estimates the gain introduced by the phase-locked-loop 206 at step 504. This may include, for example, the controller 224 configuring the frequency synthesizer 200 as a frequency-locked loop. As particular examples, this may include the controller 224 shorting the capacitor 404 in the loop filter 212 to the common mode voltage 302 and overriding the UP and DOWN outputs of the phase detector 208. This may also include the controller 224 allowing the gain calibration loop 300 to operate and identify the gain using the results produced by the gain calibration circuit 400.

The frequency synthesizer 200 estimates the response of the loop filter 212 at step 506. This may include, for example, the frequency synthesizer 200 using the formulas above to identify values for $\omega_{Z\_ACTUAL}$ and $\omega_{P2\_ACTUAL}$.

The frequency synthesizer 200 and controller 224 identify coefficients for the pre-distortion filter 222 at step 508. This may include, for example, the frequency synthesizer 200 identifying the transfer function of the frequency synthesizer 200. This may also include the frequency synthesizer 200 identifying the inverse of this transfer function to identify another transfer function that is associated with the desired pre-distortion filter 222. This may further include the frequency synthesizer 200 identifying the coefficient values using the second transfer function. In addition, this may include the controller 224 updating the pre-distortion filter 222 with the new coefficient values.

The frequency synthesizer 200 allows its output to settle at step 510. This may include, for example, the frequency synthesizer 200 waiting for a specified period of time. During this time, the pre-distortion filter 222 may settle and begin operating with its new coefficient values. The frequency synthesizer 200 transmits data at step 512. This may include, for example, the frequency synthesizer 200 filtering an input signal 202 using the new settings in the pre-distortion filter 222.

Although FIG. 5 illustrates one example of a method 500 for digital pre-distortion compensation, various changes may be made to FIG. 5. For example, additional factors could be used to identify coefficient values for the pre-distortion filter 222.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method, comprising:
   identifying a setting for a capacitor bank associated with a voltage-controlled oscillator in a closed-loop phase-locked-loop, the setting representing a combination of one or more capacitors in the capacitor bank;
   estimating a gain introduced by the closed-loop phase-locked-loop when the oscillator operates using the identified setting;
   estimating a response of a loop filter in the phase-locked-loop;
   identifying one or more coefficients for a digital filter using the identified gain and the identified loop filter response, the digital filter operable to filter an input signal; and
   modulating the filtered input signal using the phase-locked-loop to produce an output signal.

2. The method of claim 1, wherein identifying the setting for the capacitor bank comprises:
   scaling the output signal produced by the voltage-controlled oscillator;
   clocking a counter using the scaled output signal to produce a counter signal;
   estimating a frequency of the counter signal a plurality of times;
   identifying differences between the estimated frequencies and a desired frequency;
   accumulating the differences;
   filtering the accumulated differences; and
   processing the filtered accumulated differences to produce the setting for the capacitor bank.

3. The method of claim 1, wherein estimating the gain introduced by the closed-loop phase-locked-loop comprises:
   setting a desired frequency associated with the phase-locked-loop to a first value;

identifying a first input value to a digital-to-analog converter in a charge pump in the phase-locked-loop;

setting the desired frequency to a second value;

identifying a second input value to the digital-to-analog converter;

identifying a difference between the first and second input values; and identifying the gain of the phase-locked-loop using the identified difference.

4. The method of claim 3, wherein the identified gain comprises an estimated unity gain bandwidth; and further comprising:
identifying an ideal input value for the digital-to-analog converter;

rounding down the ideal input value to generate an actual input value; and identifying an actual gain introduced by the phase-locked-loop using the actual input value.

5. The method of claim 4, wherein estimating the response of the loop filter comprises:

identifying an error between the ideal input value for the digital-to-analog converter and the actual input value; and estimating the response of the loop filter using the identified error.

6. The method of claim 1, wherein identifying the one or more coefficients for the digital filter comprises:

identifying a transfer function from the input signal to the output signal;

transforming the transfer function to generate a transformed transfer function; and calculating one or more values for the one or more coefficients using the transformed transfer function.

7. The method of claim 1, wherein the digital filter alters the input signal to at least partially compensate for an irregularity introduced into the output signal by the closed-loop phase-locked-loop.

8. The method of claim 1, wherein:

the phase-locked-loop and the digital filter form at least a portion of a frequency synthesizer;

the frequency synthesizer occupies no more than 4 mm$^2$ of space;

the frequency synthesizer operates using no more than 35 mA of current; and the estimating steps, the identifying steps, and a time needed for the phase-locked-loop to settle collectively take no more than 140 $\mu$s.

9. A frequency synthesizer, comprising:

a digital filter operable to receive and filter an input signal;

a closed-loop phase-locked-loop comprising a voltage-controlled oscillator and a loop filter, the phase-locked-loop operable to receive the filtered input signal and generate an output signal; and a controller operable to:
identify a setting for a capacitor bank associated with the voltage-controlled oscillator, the setting representing a combination of one or more capacitors in the capacitor bank;

estimate a gain introduced by the phase-locked-loop when the oscillator operates using the identified setting;

estimate a response of the loop filter;

identify one or more coefficients for the digital filter using the identified gain and the identified loop filter response.

10. The frequency synthesizer of claim 9, wherein the controller is operable to identify the setting for the capacitor bank by receiving the setting from a capacitor select circuit, the capacitor select circuit comprising:

a prescaler operable to scale the output signal produced by the voltage-controlled oscillator;

a counter operable to be clocked by the scaled output signal to produce a counter signal;

a digital frequency discriminator operable to estimate a frequency of the counter signal a plurality of times;

an adder operable to identify differences between the estimated frequencies and a desired frequency;

an integrator operable to accumulate the differences;

a low-pass filter operable to filter the accumulated differences; and an averaging unit operable to average the filtered accumulated differences to produce the setting for the capacitor bank.

11. The frequency synthesizer of claim 9, wherein the controller is operable to estimate the gain by:

setting a desired frequency associated with the phase-locked-loop to a first value;

identifying a first input value to a digital-to-analog converter in a charge pump in the phase-locked-loop;

setting the desired frequency to a second value;

identifying a second input value to the digital-to-analog converter;

identifying a difference between the first and second input values; and identifying the gain of the phase-locked-loop using the identified difference.

12. The frequency synthesizer of claim 11, wherein:

the identified gain comprises an estimated unity gain bandwidth; and the controller is further operable to estimate the gain by:
identifying an ideal input value for the digital-to-analog converter;

rounding down the ideal input value to generate an actual input value; and identifying an actual gain of the phase-locked-loop using the actual input value.

13. The frequency synthesizer of claim 12, wherein the controller is operable to estimate the response of the loop filter by:

identifying an error between the ideal input value for the digital-to-analog converter and the actual input value; and estimating the response of the loop filter using the identified error.

14. The frequency synthesizer of claim 9, wherein the controller is operable to identify the one or more coefficients for the digital filter by:

identifying a transfer function from the input signal to the output signal;

transforming the transfer function to generate a transformed transfer function; and calculating one or more values for the one or more coefficients using the transformed transfer function.

15. The frequency synthesizer of claim 9, wherein the digital filter alters the input signal to at least partially compensate for an irregularity introduced into the output signal by the closed-loop phase-locked-loop.

16. The frequency synthesizer of claim 9, wherein:

the frequency synthesizer occupies no more than 4 mm² of space;

the frequency synthesizer operates using no more than 35 mA of current; and the frequency synthesizer is operable to perform the estimating and the identifying functions and the phase-locked-loop is operable to settle collectively within no more than 140 µs.

17. A wireless device, comprising:

an antenna operable to transmit outgoing signals over a wireless interface; and a transceiver operable to generate the outgoing signals, the transceiver comprising a frequency synthesizer, the frequency synthesizer comprising:

- a digital filter operable to receive and filter an input signal;
- a closed-loop phase-locked-loop comprising a voltage-controlled oscillator and a loop filter, the phase-locked-loop operable to receive the filtered input signal and generate the outgoing signal; and
- a controller operable to:
  - identify a setting for a capacitor bank associated with the voltage-controlled oscillator, the setting representing a combination of one or more capacitors in the capacitor bank;
  - estimate a gain introduced by the phase-locked-loop when the oscillator operates using the identified setting;
  - estimate a response of the loop filter; and
  - identify one or more coefficients for the digital filter using the identified gain and the identified loop filter response.

18. The wireless device of claim 17, wherein the controller is operable to identify the setting for the capacitor bank by receiving the setting from a capacitor select circuit, the capacitor select circuit comprising:

a prescaler operable to scale the outgoing signal produced by the voltage-controlled oscillator;

a counter operable to be clocked by the scaled outgoing signal to produce a counter signal;

a digital frequency discriminator operable to estimate a frequency of the counter signal a plurality of times;

an adder operable to identify differences between the estimated frequencies and a desired frequency;

an integrator operable to accumulate the differences;

a low-pass filter operable to filter the accumulated differences; and an averaging unit operable to average the filtered accumulated differences to produce the setting for the capacitor bank.

19. The wireless device of claim 17, wherein the controller is operable to estimate the gain and the response by:

setting a desired frequency associated with the phase-locked-loop to a first value;

identifying a first input value to a digital-to-analog converter in a charge pump in the phase-locked-loop;

setting the desired frequency to a second value;

identifying a second input value to the digital-to-analog converter;

identifying a difference between the first and second input values;

estimating a unity gain bandwidth of the phase-locked-loop using the identified difference;

identifying an ideal input value for the digital-to-analog converter;

rounding down the ideal input value to generate an actual input value;

identifying an actual gain of the phase-locked-loop using the actual input value;

identifying an error between the ideal input value for the digital-to-analog converter and the actual input value; and estimating the response of the loop filter using the identified error.

20. The wireless device of claim 17, wherein the controller is operable to identify the one or more coefficients for the digital filter by:

identifying a transfer function from the input signal to the outgoing signal;

transforming the transfer function to generate a transformed transfer function; and calculating one or more values for the one or more coefficients using the transformed transfer function.

* * * * *

UNITED STATES PATENT AND TRADEMARK OFFICE
CERTIFICATE OF CORRECTION

PATENT NO. : 6,833,767 B1
APPLICATION NO. : 10/606682
DATED : December 21, 2004
INVENTOR(S) : William J. Huff, Lawrence J. Malone and Daniel R. Meacham It is certified that error appears in the above-identified patent and that said Letters Patent is hereby corrected as shown below:

Column 5,
Line 46, delete "(AS)" and replace with -- ($\Delta\Sigma$) --;

Column 7,
Line 23, delete "is";
Line 56, delete "FREF" and replace with -- $f_{REF}$ --.

Column 9,
Line 18, insert -- $VCM + DAC_{SETTING}I_{LSB}R_I$ -- after "formula:";
Line 42, delete "$_{DAC}$" and insert -- DAC --;
Line 66, delete "$\omega_{LOOP}$ DESIRED" and replace with -- $\omega_{LOOP\_DESIRED}$ --;

Column 11,
Line 28, delete "4 mM$^2$" and replace with -- 4 mm$^2$ --;
Line 31, delete "As" and replace with -- $\mu$s --.

Signed and Sealed this

Eleventh Day of July, 2006

JON W. DUDAS
*Director of the United States Patent and Trademark Office*